United States Patent
Watanabe et al.

(10) Patent No.: US 7,400,023 B2
(45) Date of Patent: Jul. 15, 2008

(54) PHOTOELECTRIC CONVERTING FILM STACK TYPE SOLID-STATE IMAGE PICKUP DEVICE AND METHOD OF PRODUCING THE SAME

(75) Inventors: Mikio Watanabe, Kanagawa (JP);
Tomoki Inoue, Kanagawa (JP);
Masafumi Inuiya, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 376 days.

(21) Appl. No.: 11/082,901

(22) Filed: Mar. 18, 2005

(65) Prior Publication Data

US 2005/0230775 A1 Oct. 20, 2005

(30) Foreign Application Priority Data

Mar. 18, 2004 (JP) ............................ 2004-077663
Mar. 18, 2004 (JP) ............................ 2004-077664

(51) Int. Cl.
*H01L 31/062* (2006.01)

(52) U.S. Cl. ............... 257/448; 257/444; 257/E31.124; 257/E31.001; 257/E31.126; 257/443; 257/E27.114; 257/E27.116; 257/E27.118; 257/440

(58) Field of Classification Search .................. 257/444, 257/443, E31.124, E31.001, E31.126, E27.114, 257/E27.116, E27.118, 440, 233, 448, 465, 257/E31.113, E31.115, E51.019, E51.012

See application file for complete search history.

(56) References Cited

U.S. PATENT DOCUMENTS 5,739,851 A * 4/1998 Ohsawa et al. ............... 348/311
6,157,020 A * 12/2000 Krapf et al. ........... 250/214 LA

FOREIGN PATENT DOCUMENTS

| JP | 58-103165 A | 6/1983 |
| JP | 2002-83946 A | 3/2002 |
| JP | 3405099 B2 | 3/2003 |
| JP | 2003-332551 A | 11/2003 |

* cited by examiner

*Primary Examiner*—Matthew C. Landau
*Assistant Examiner*—Jay C. Kim
(74) *Attorney, Agent, or Firm*—Sughrue Mion, PLLC

(57) ABSTRACT

In a photoelectric converting film stack type solid-state image pickup device, a plurality of photoelectric converting film are stacked on a semiconductor substrate in which a signal readout circuit is formed, each of the photoelectric converting films is sandwiched between a common electrode film and pixel electrode films corresponding to respective pixels, and photo-charges generated in the photoelectric converting films are taken out through the pixel electrode films. In the solid-state image pickup device, a common electrode film for a first photoelectric converting film is used also as a common electrode film for a second photoelectric converting film, the first photoelectric converting film is stacked below the common electrode film, and the second photoelectric converting film is stacked above the common electrode film.

5 Claims, 15 Drawing Sheets

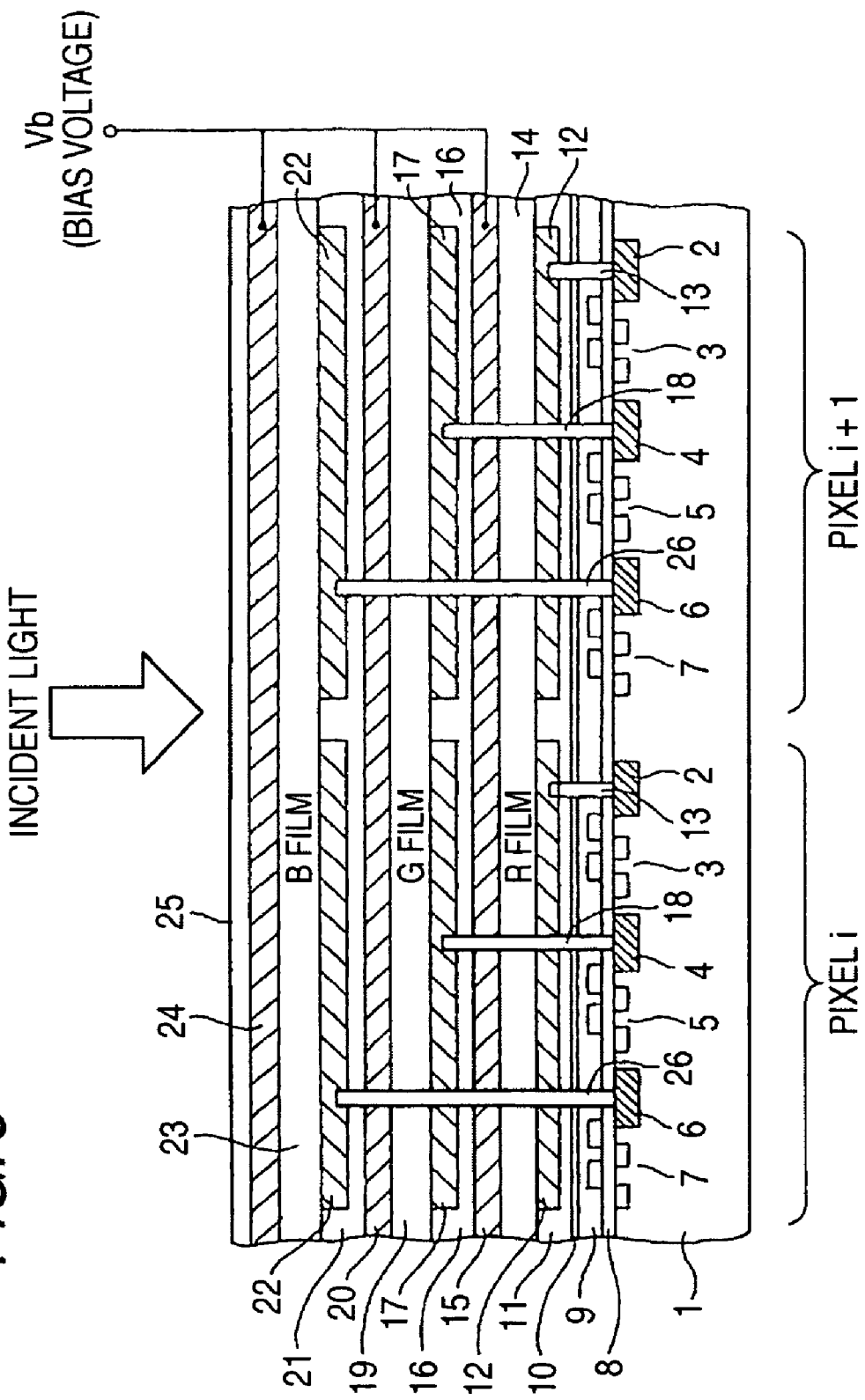

PHOTOELECTRIC CONVERTING FILM STACK TYPE SOLID-STATE IMAGE PICKUP DEVICE AND METHOD OF PRODUCING THE SAME

BACKGROUND OF THE INVENTION

1. Field of the Invention

The present invention relates to a photoelectric converting film stack type solid-state image pickup device, which is configured by stacking photoelectric converting films on a semiconductor substrate in which a signal readout circuit is formed in the surface.

2. Description of the Invention

A prototype of a photoelectric converting film stack type solid-state image pickup device is disclosed in, for example, JP-A-58-103165. The solid-state image pickup device has a configuration in which three photosensitive layers are stacked on a semiconductor substrate, and electric signals for red (R), green (G), and blue (B) respectively detected by the photosensitive layers are read out by MOS circuits formed in the surface of the semiconductor substrate.

Solid-state image pickup devices having such a configuration have been proposed in the past. Thereafter, the techniques of developing a CCD image sensor and a CMOS image sensor in which many light receiving portions (photodiodes) are arranged in a surface portion of a semiconductor substrate and color filters of red (R), green (G), and blue (B) are stacked on the light receiving portions have been significantly advanced. At present, an image sensor with several million light receiving portions (pixels) integrated on the surface is mounted on a digital still camera.

The techniques of developing a CCD image sensor and a CMOS image sensor are advanced close to their limits or to the level where each light receiving pixel has an opening of about 2 μm that is on the order of the wavelength of incident light. Therefore, the techniques face a problem in that the production yield of photo-charges is poor.

The upper limit of the amount of photo-charges which can be accumulated in one miniaturized light receiving pixel is low or about 3,000 electrons. It is difficult to clearly express 256 gradations by using such a small amount of photo-charges. Therefore, it is hardly expected that an image sensor which is superior to the related-art one in image quality and in sensitivity is realized by a CCD or CMOS device.

The solid-state image pickup device proposed in JP-A-58-103165 has attracted attention as a device which can solve these problems, and image sensors are then proposed in Japanese Patent No. 3,405,099 and JP-A-2002-83946.

In the image sensor disclosed in Japanese Patent No. 3,405,099, a photoelectric converting layer is formed by dispersing ultrafine particles of silicon in a medium, three such photoelectric converting layers in which ultrafine particles have different diameters are stacked on a semiconductor substrate, and the photoelectric converting layers generate electric signals corresponding to the amounts of received light of red, green, and blue, respectively.

The image sensor disclosed in JP-A-2002-83946 is configured in a similar manner, or so that three nanosilicon layers of different particle diameters are stacked on a semiconductor substrate, and electric signals of red, green, and blue detected by the nanosilicon layers are read out to accumulation diodes formed in a surface portion of the semiconductor substrate.

In the image sensor disclosed in FIGS. 5 and 6(b) of JP-A-2003-332551, red-color filter photodiodes and blue-color filter photodiodes are disposed in a surface portion of a semiconductor substrate in the same manner as the related-art CCD or CMOS image sensor, and only one green-detection photoelectric converting film is disposed above the semiconductor substrate in place of a green-color filter photodiode.

FIG. 5 is a sectional diagram showing two pixels of the related-art photoelectric converting film stack type solid-state image pickup device. A CMOS signal readout circuit is formed in a surface portion of a semiconductor substrate 1 which serves as a ground of the photoelectric converting film stack type solid-state image pickup device. Referring to FIG. 5, a heavily-doped impurity region 2 for accumulating a red signal, a MOS circuit 3 for reading out the red signal, a heavily-doped impurity region 4 for accumulating a green signal, a MOS circuit 5 for reading out the green signal, a heavily-doped impurity region 6 for accumulating a blue signal, and a MOS circuit 7 for reading out the blue signal are formed in a surface portion of a P-well layer 1 formed in an n-type semiconductor substrate.

Each of the MOS circuits 3, 5, 7 is configured by impurity regions which are formed in the surface of the semiconductor substrate, and which are used for a source and a drain, and a gate electrode which is formed via a gate insulating film 8, respectively. An insulating film 9 is formed above the gate insulating film 8 and the gate electrodes to flatten the surface, and a light shielding film 10 is stacked on the insulating film. In many cases, the light shielding film is formed by a metal thin film, and hence a further insulating film 11 is formed on the light shielding film.

Signal charges accumulated in the heavily-doped impurity regions 2, 4, 6 for accumulating respective color signals are read out to the outside by the MOS circuits 3, 5, 7.

Pixel electrode films 12 which are separated from one another so as to correspond to respective pixels are formed on the insulating film 11 shown in FIG. 5. For each of the pixels, the pixel electrode film 12 for the pixel is electrically connected through a columnar electrode 13 to the heavily-doped impurity region 2 for accumulating the red signal. The columnar electrode 13 is electrically insulated from the other components except the pixel electrode film 12 and the heavily-doped impurity region 2.

A red-detection photoelectric converting film 14 is formed above the pixel electrode films 12, and a transparent common electrode film 15 is formed above the photoelectric converting film. The photoelectric converting film 14 and the common electrode film 15 are not required to be disposed for each pixel, and are formed flatly over the entire face of the semiconductor substrate by respective single-film configurations.

Similarly, a transparent insulating film 16 is formed above the common electrode film 15, and transparent pixel electrode films 17 which are separated from one another so as to correspond to respective pixels are formed above the insulating film. For each of the pixels, the pixel electrode film 17 for the pixel is electrically connected by a columnar electrode 18 to the heavily-doped impurity region 4 for accumulating the green signal. The columnar electrode 18 is electrically insulated from the other components except the pixel electrode film 17 and the heavily-doped impurity region 4. A green-detection photoelectric converting film 19 is formed above the pixel electrode films 17 by a single-film configuration in the same manner as the photoelectric converting film 14. A transparent common electrode film 20 is formed above the photoelectric converting film.

A transparent insulating film 21 is formed above the common electrode film 20, and pixel electrode films 22 which are separated from one another so as to correspond to respective pixels are formed above the insulating film. For each of the pixels, the pixel electrode film 22 for the pixel is electrically connected by a columnar electrode 26 to the heavily-doped impurity region 6 for accumulating the blue signal. The columnar electrode 26 is electrically insulated from the other components except the pixel electrode film 22 and the heavily-doped impurity region 6. A blue-detection photoelectric converting film 23 is formed above the pixel electrode films 22. A transparent common electrode film 24 is formed above the photoelectric converting film. A transparent protective film 25 is formed in the uppermost layer.

When the light comes on the solid-state image pickup device, photo-charges corresponding to the amounts of the incident color lights of blue light, green light, and red light are excited in the photoelectric converting films 23, 19, 14, respectively. When a certain voltage is applied between the common electrode films 24, 20, 15 and the pixel electrode films 22, 17, 12, the photo-charges flow into the heavily-doped impurity regions 6, 4, 2, and are then read out as the blue, green, and red signals by the MOS circuits 7, 5, 3, respectively.

In the photoelectric converting film stack type solid-state image pickup device having the configuration shown in FIG. 5, the twelve films in total, or the pixel electrode film 12, the red-detection photoelectric converting film 14, the common electrode film 15, the insulating film 16, the pixel electrode film 17, the green-detection photoelectric converting film 19, the common electrode film 20, the insulating film 21, the pixel electrode film 22, the blue-detection photoelectric converting film 23, the common electrode film 24, and the protective film 25 must be stacked on the insulating film 11 on the surface of the semiconductor substrate.

In producing such a photoelectric converting film stack type solid-state image pickup device, in order to improve the production yield and to lower the production cost, it is necessary to reduce the number of production steps. When even one step of stacking the twelve films is omitted, the production yield is correspondingly improved, and the production cost is lowered.

In the case where such a photoelectric converting film stack type solid-state image pickup device is to be produced, the portion on the side of the semiconductor substrate can be formed in the same manner as that in the related-art CCD or CMOS image sensor, and the related-art technique of producing a semiconductor device can be employed without modification. Moreover, also the photoelectric converting films that are stacked on the semiconductor substrate, electrode films for sandwiching the photoelectric converting films, and insulating films can be easily formed using a film-forming method based on a printing technique, the spraying method, the vacuum evaporation method, the sputtering method, the CVD method, or the like.

However, conductor lines by which a signal readout circuit formed in the semiconductor substrate is connected to pixel electrode films for the photoelectric converting files stacked on the semiconductor substrate cannot be easily formed because such conductor lines must be formed as vertical ones which elongate in a direction perpendicular to the planes of the pixel electrode films.

For example, a solid-state image pickup device in which three or R-, G-, and B-photoelectric converting films are stacked has a configuration that the three color signals of red (R), green (G), and blue (B) are read out from one pixel. In this case, three vertical conductor lines must be disposed for each pixel, and the three vertical conductor lines have different heights.

Such vertical conductor lines can be formed by, after an insulating film is formed on the semiconductor substrate, repeating many times a work of etching away portions where the vertical conductor lines are to be formed, embedding a conductor in the portions, growing a photoelectric converting film, etching away portions where the vertical conductor lines are to be formed, and embedding the conductor in the portions.

However, the work has problems that alignment is not easily conducted, and that, when misalignment once occurs, the vertical conductor lines are not connected and photo-changer signals from the converting films cannot be transferred and read out. In order to form several million pixels in one solid-state image pickup device, it is required to form vertical conductor lines the number of which is three times that of the pixels. Moreover, a vertical conductor line through which photo-changer signals generated in an upper photoelectric converting film go to a signal readout circuit on a semiconductor substrate must be formed so as to be insulated from other photoelectric converting films and electrode films along the route, or not to make electrical contact therewith. This causes a problem that such a device is hard to produce and the production cost is high.

SUMMARY OF THE INVENTION

It is an object of the invention to provide a photoelectric converting film stack type solid-state image pickup device in which the production cost can be lowered, and the production yield can be improved.

It is an object of the invention to provide a method of producing a photoelectric converting film stack type solid-state image pickup device in which the production cost can be lowered, and vertical conductor lines enabling photoelectrical conversion signals generated in upper photoelectric converting films to be transferred to a signal readout circuit can be formed without causing breakage.

According to the invention, there is provided a photoelectric converting film stack type solid-state image pickup device comprising: a semiconductor substrate in which a signal readout circuit is formed; a plurality of photoelectric converting films stacked above the semiconductor substrate, said plurality of photoelectric converting films comprising a first photoelectric converting film and a second photoelectric converting film; a common electrode film; and pixel electrode films corresponding to pixels, wherein each of the photoelectric converting films is sandwiched between a common electrode film and the pixel electrode films, wherein photo-charges generated in the photoelectric converting films are taken out through the pixel electrode films, wherein the common electrode film for the first photoelectric converting film is used also as the common electrode film for the second photoelectric converting film, the first photoelectric converting film is stacked below the common electrode film, and the second photoelectric converting film is stacked above the common electrode film.

According to the configuration, the number of layers to be stacked on the semiconductor substrate can be reduced, so that the production cost can be lowered, and the production yield can be improved.

According to the invention, there is provided the photoelectric converting film stack type solid-state image pickup device, wherein said plurality of photoelectric converting films comprise three photoelectric converting films which detect red, green, and blue light, respectively, said three photoelectric converting films being arranged so that they start from an upper side in ascending order of detection wavelengths, and two of said three photoelectric converting films share one common electrode film.

According to the configuration, of a photoelectric converting film stack type solid-state image pickup device which can detect the three primary colors, the production cost can be lowered, and the production yield can be improved.

According to the invention, there is provided the photoelectric converting film stack type solid-state image pickup device, wherein said plurality of photoelectric converting films comprise four photoelectric converting films which detect red, green, blue, and emerald light, respectively, said four photoelectric converting films being arranged so that they start from an upper side in ascending order of detection wavelengths, and two of said four photoelectric converting films share one common electrode film, said two photoelectric converting films being adjacent to each other.

According to the configuration, of a photoelectric converting film stack type solid-state image pickup device in which color reproduction corresponding to the human visual sensitivity is enabled, the production cost can be lowered, and the production yield can be improved.

According to the invention, there is provided the photoelectric converting film stack type solid-state image pickup device, wherein the common electrode film for a lowest one of the photoelectric converting films which are stacked on the semiconductor substrate is placed below the lowest photoelectric converting film, and the common electrode film is used also as a light shielding film.

According to the configuration also, it is possible to obtain a photoelectric converting film stack type solid-state image pickup device in which the number of production steps can be reduced, the production cost can be lowered, and the production yield can be improved.

According to the invention, there is provided a method of producing a photoelectric converting film stack type solid-state image pickup device in which a plurality of photoelectric converting films are stacked on a semiconductor substrate via insulating films, each of the photoelectric converting films being sandwiched between a common electrode film and pixel electrode films corresponding to pixels, the method comprising: forming vertical conductor lines which are to be connected to a signal readout circuit formed in a surface portion of the semiconductor substrate, each of the vertical conductor lines being to be passed through a lower one of the photoelectric converting films, the common electrode film and the insulating film, and to be connected to the corresponding one of pixel electrode films that sandwiches an above one of the photoelectric converting films with the common electrode film; covering the vertical conductor lines with an insulating material; and stacking the lower photoelectric converting film, the common electrode film and the insulating film.

According to the configuration, the vertical conductor lines can be formed without causing breakage, and the films can be easily stacked. In the photoelectric converting film stack type solid-state image pickup device, therefore, the production cost can be lowered, and the production yield can be improved.

According to the invention, there is provided the method of producing a photoelectric converting film stack type solid-state image pickup device, wherein said plurality of photoelectric converting films comprise three photoelectric converting films which detect red, green, and blue light, respectively, said three photoelectric converting films being arranged so that they start from an upper side in ascending order of detection wavelengths, and two of said three photoelectric converting films share one common electrode film.

According to the configuration, it is possible to easily produce a photoelectric converting film stack type solid-state image pickup device which can take a color image from the three primary colors.

According to the invention, there is provided the method of producing a photoelectric converting film stack type solid-state image pickup device, wherein said plurality of photoelectric converting films comprise four photoelectric converting films that detect red, green, blue, and emerald light respectively, said four photoelectric converting films being arranged so that they start from an upper side in ascending order of detection wavelengths, and two of said four photoelectric converting films share one common electrode film, said two photoelectric converting films being adjacent to each other.

According to the configuration, it is possible to easily produce a photoelectric converting film stack type solid-state image pickup device which can take a color image corresponding to the human visual sensitivity.

According to the invention, there is provided a method of producing a photoelectric converting film stack type solid-state image pickup device in which a photoelectric converting film sandwiched between a common electrode film and pixel electrode films corresponding to pixels is stacked on a semiconductor substrate, the method comprising: forming vertical conductor lines which are connected to a signal readout circuit formed in a surface portion of the semiconductor substrate, wherein a tip end portion of each of vertical conductor lines reaches a position of a corresponding one of the pixel electrode films; forming components of a layer in which the vertical conductor lines are buried; and forming on a surface of the layer the pixel electrode films to which the tip end portions are connected.

According to the configuration, the vertical conductor lines can connect the signal readout circuit to corresponding pixel electrode films without causing breakage.

According to the invention, there is provided the method of producing a photoelectric converting film stack type-solid-state image pickup device, wherein the photoelectric converting film is an photoelectric converting film which detects an amount of incident green light; and the components of the layer are red-light transmission color filters, blue-light transmission color filters, and an insulating layer in which the red-light transmission color filters and the blue-light transmission color filters are buried, the red-light transmission color filters and the blue-light transmission color filters being disposed respectively above red-detection photodiodes and blue-detection photodiodes which are disposed in the surface portion of the semiconductor substrate.

According to the configuration, it is possible to provide a photoelectric converting film stack type solid-state image pickup device which can be easily produced.

BRIEF DESCRIPTION OF THE DRAWINGS

FIG. 5 is a sectional diagram showing two pixels of the related-art photoelectric converting film stack type solid-state image pickup device having a three-layer structure;

DETAILED DESCRIPTION OF THE INVENTION

Hereinafter, embodiments of the invention will be described with reference to the accompanying drawings.

Figure 1:
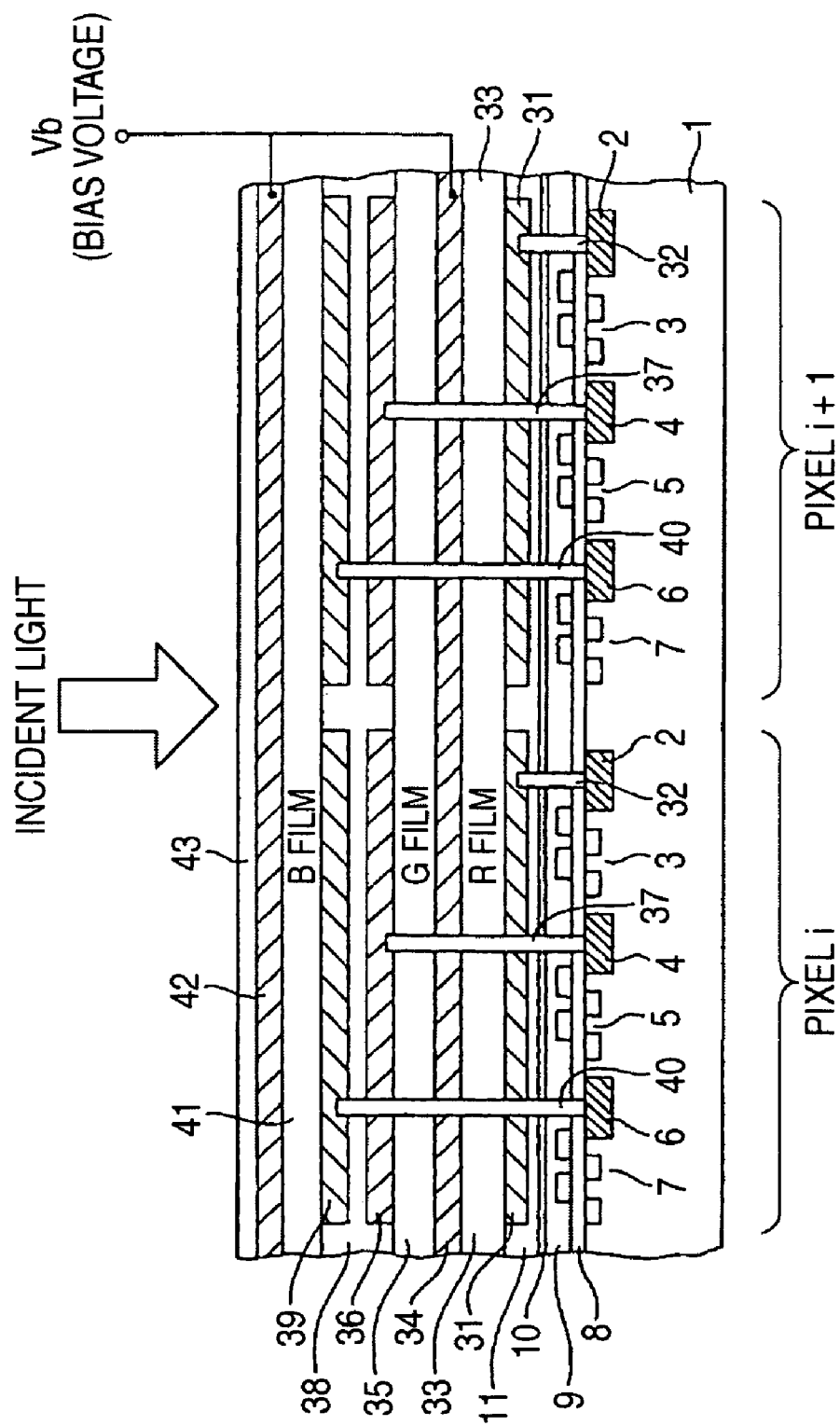
FIG. 1 is a sectional diagram showing two pixels of a photoelectric converting film stack type solid-state image pickup device having a three-layer structure according to a first embodiment of the invention.

FIG. 1 is a sectional diagram showing two pixels of a photoelectric converting film stack type solid-state image pickup device of an embodiment of the invention. In the structure of the photoelectric converting film stack type solid-state image pickup device of the embodiment, the structure of the semiconductor substrate portion, i.e., that of the range up to the insulating film 11 is identical with that of the photoelectric converting film stack type solid-state image pickup device which has been described with reference to FIG. 5.

Referring to FIG. 1, pixel electrode films 31 which are separated so as to correspond to respective pixels are formed on the insulating film 11. The pixel electrode film 31 for each pixel is electrically connected by a columnar electrode 32 to the heavily-doped impurity region 2 for the pixel. The columnar electrode 32 is electrically insulated from the other components except the pixel electrode film 31 and the heavily-doped impurity region 2.

A red-detection photoelectric converting film 33 which is not divided for each pixel, and which is formed by a single-film configuration is stacked on the pixel electrode films 31. A transparent common electrode film 34 which is similarly formed by a single-film configuration is stacked above the photoelectric converting film.

In the embodiment, a green-detection photoelectric converting film 35 which is not divided for each pixel, and which is formed by a single-film configuration is stacked on the common electrode film 34, and transparent pixel electrode films 36 which are separated so as to correspond to pixels are stacked above the photoelectric converting film. For each of the pixels, the pixel electrode film 36 is electrically connected by a columnar electrode 37 to the heavily-doped impurity region 4 for the pixel. The columnar electrode 37 is electrically insulated from the other components except the pixel electrode film 36 and the heavily-doped impurity region 4.

A transparent insulating film 38 is stacked on the pixel electrode films 36, and transparent pixel electrode films 39 which are separated so as to correspond to pixels are stacked on the insulating film. For each of the pixels, the pixel electrode film 39 for the pixel is electrically connected by a columnar electrode 40 to the heavily-doped impurity region 6 for the pixel. The columnar electrode 40 is electrically insulated from the other components except the pixel electrode film 39 and the heavily-doped impurity region 6.

A blue-detection photoelectric converting film 41 which is not divided for each pixel, and which is formed by a single-film configuration is stacked on the pixel electrode films 39, and a transparent common electrode film 42 which is similarly formed by a single-film configuration is stacked on the photoelectric converting film. A transparent protective film 43 is formed in the uppermost layer.

In the photoelectric converting film stack type solid-state image pickup device of the embodiment, although the device is configured so as to detect three color signals of red (R), green (G), and blue (B), only two films are used as common electrode films, and the two common electrode films 42, 34 are connected to a bias voltage Vb.

In the embodiment, the ten films in total, or the pixel electrode film 31, the red-detection photoelectric converting film 33, the common electrode film 34, the green-detection photoelectric converting film 35, the pixel electrode film 36, the insulating film 38, the pixel electrode film 39, the blue-detection photoelectric converting film 41, the common electrode film 42, and the protective film 43 are stacked on the insulating film 11 on the side of the semiconductor substrate. Namely, steps of stacking two layers can be omitted as compared with the configuration of FIG. 5.

In the thus configured photoelectric converting film stack type solid-state image pickup device, when light comes in the device, photo-charges corresponding to the amount of the incident blue light are generated in the photoelectric converting film 41, and, when a voltage is applied between the common electrode film 42 and the pixel electrode film 39, the photo-charges of blue light flow into the heavily-doped impurity regions 6.

Similarly, photo-charges corresponding to the amount of green light of the incident light are generated in the photoelectric converting film 35, and, when a voltage is applied between the common electrode film 34 and the pixel electrode film 36, the photo-charges of green light flow into the heavily-doped impurity regions 4.

Similarly, photo-charges corresponding to the amount of red light of the incident light are generated in the photoelectric converting film 33, and, when a voltage is applied between the common electrode film 34 and the pixel electrode film 31, the photo-charges of red light flow into the heavily-doped impurity regions 2.

In the embodiment, as described above, the three color signals of red (R), green (G), and blue (B) can be read out, and the number of production steps can be reduced, so that the production yield can be improved and the production cost can be lowered.

In the examples shown in FIGS. 1 and 5, light which obliquely falls on, for example, the blue (B)-detection photoelectric converting film of a pixel i fall also on the green (G)- and red (R)-detection photoelectric converting films of an adjacent pixel i+1, thereby causing a possibility that the crosstalk between pixels occurs. In the configuration of FIG. 1, however, the total film thickness is thinner by the corresponding two films than that of the configuration of FIG. 5, and hence there are further advantages that the possibility of crosstalk between pixels is reduced, and that color reproduction is improved.

The device of the embodiment has the configuration in which signals are read out by the MOS circuits formed in the semiconductor substrate. Alternatively, the device may be configured so that, in the same manner as the related-art CCD image sensor, accumulated charges in the heavily-doped impurity regions 2, 4, 6 are transferred along vertical transfer paths, and then are read out to the outside along a horizontal transfer path.

Figure 2:
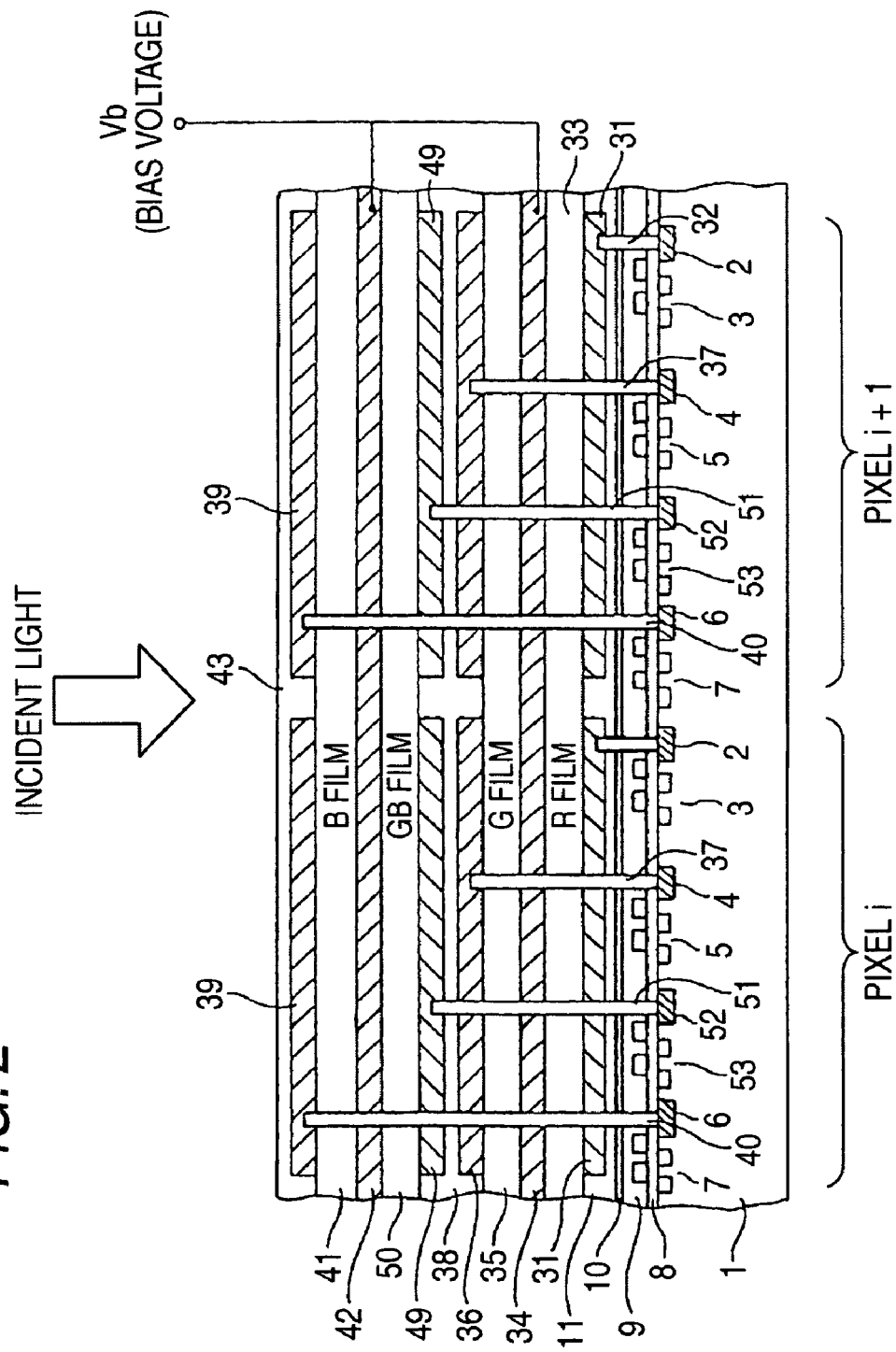
FIG. 2 is a sectional diagram showing two pixels of a photoelectric converting film stack type solid-state image pickup device having a four-layer structure according to a second embodiment of the invention.

The embodiment shown in FIG. 1 is an example of a photoelectric converting film stack type solid-state image pickup device which detects the three primary colors red (R), green (G), and blue (B). Alternatively, the device may be configured in order to detect four colors. FIG. 2 is a sectional diagram showing two pixels of a photoelectric converting film stack type solid-state image pickup device which detects four colors. The device is different from the configuration of FIG. 1 in that a photoelectric converting film 50 and electrodes which are used for detecting a medium color (GB: emerald) between green (G) and blue (B) are formed in the stack sequence described below.

Figure 3:
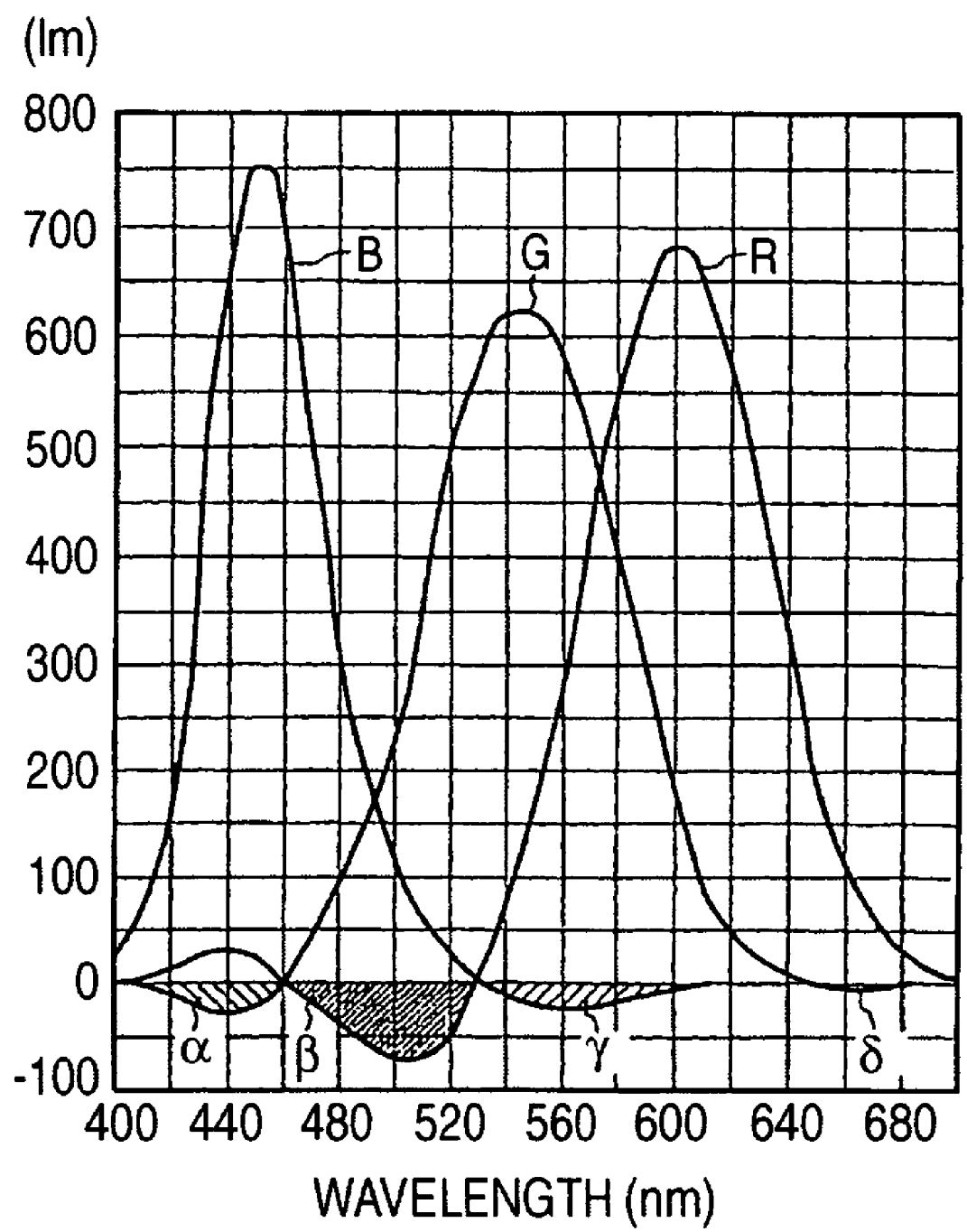
FIG. 3 is a graph showing the human visual sensitivity.

For example, detection of emerald (GB) color of a wavelength of 480 to 520 nm provides an advantage that red color is corrected in accordance with the human visual sensitivity. As indicated by α, β, and γ in FIG. 3, the human visual sensitivity has a negative sensitivity for green (G), red (R), and blue (B). Even when a solid-state image pickup device detects only positive sensitivities for R, G, and B to reproduce a color, therefore, it is impossible to reproduce an image which is viewed by a person. To comply with this, the photoelectric converting film 50 detects the largest negative sensitivity β, i.e., the negative sensitivity for red, and the degree corresponding to the negative sensitivity is subtracted from the sensitivity for red detected by the photoelectric converting film 33, whereby the human sensitivity for red can be reproduced.

In FIG. 2, the film formation of the range up to the insulating film 38 is identical with that of the embodiment of FIG. 1. In the present embodiment, transparent pixel electrode films 49 which are separated so as to correspond to respective emerald-detection pixels are formed on the insulating film 38. For each of the pixels, the pixel electrode film 49 for the pixel is electrically connected by a columnar electrode 51 to a heavily-doped impurity region 52 for the GB color which is disposed in the surface of the semiconductor substrate so as to correspond to the pixel. The columnar electrode 51 is electrically insulated from the other components except the pixel electrode film 49 and the heavily-doped impurity region 52. Signal charges in the heavily-doped impurity region 52 are read out to the outside by a MOS circuit 53 which is disposed adjacent to the region 52.

An emerald (GB)-detection photoelectric converting film 50 which is not divided for each pixel, and which is formed by a single-film configuration is stacked on the pixel electrode films 49. The transparent common electrode film 42 which is formed by a single-film configuration is formed on the photoelectric converting film.

The blue (B)-detection photoelectric converting film 41 is stacked on the common electrode film 42, and the transparent pixel electrode films 39 which are separated so as to correspond to respective pixels are stacked on the photoelectric converting film. For each of the pixels, the pixel electrode film 39 for the pixel is electrically connected by the columnar electrode 40 to the heavily-doped impurity region 6 for the pixel. The columnar electrode 40 is electrically insulated from the other components except the pixel electrode film 39 and the heavily-doped impurity region 6. The transparent protective film 43 is formed in the uppermost layer.

When the photoelectric converting film stack type solid-state image pickup device which detects the four colors blue, emerald, green, and red is configured in a similar manner as the device for three colors shown in FIG. 5, a photoelectric converting film for GB color, a common electrode film, an pixel electrode film, and an insulating film which is to be disposed with respect to another film are added. Namely, an sixteen layers in total are required above the insulating film 11. By contrast, when the stacked layer structure in the embodiment is employed, only twelve layers in total are required, and hence steps of stacking four layers can be omitted.

Figure 4:
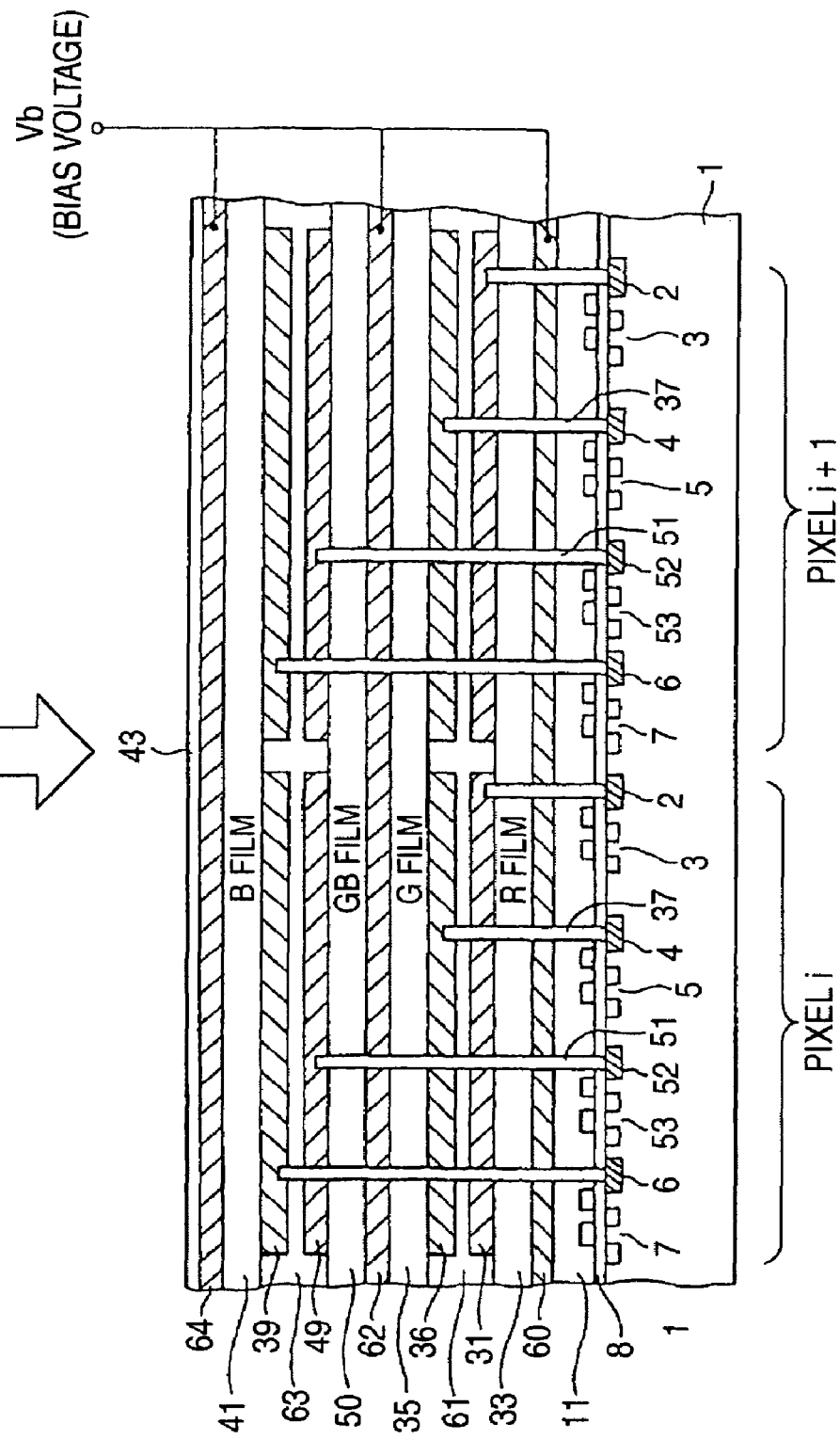
FIG. 4 is a sectional diagram showing two pixels of a photoelectric converting film stack type solid-state image pickup device having a four-layer structure according to a third embodiment of the invention.

FIG. 4 is a view showing a stacked layer structure of another embodiment of the photoelectric converting film stack type solid-state image pickup device which detects four colors blue (B), emerald (GB), green (G), and red (R). In the same manner as the embodiment of FIG. 2, the blue-detection photoelectric converting film 41, the GB-detection photoelectric converting film 50, the green-detection photoelectric converting film 35t and the red-detection photoelectric converting film 33 are disposed so that they start from the upper side in ascending order of detection wavelengths. However, the order of stacking the common electrode films and the pixel electrode films is different from that in the embodiment of FIG. 2.

In the present embodiment, specifically, a common electrode film 60, the red-detection photoelectric converting film 33, the pixel electrode films 31 for red, an insulating film 61, the pixel electrode films 36 for green, the green-detection photoelectric converting film 35, a common electrode film 62, the GB-detection photoelectric converting film 50, the pixel electrode films 49 for GB, an insulating film 63, the pixel electrode films 39 for blue, the blue-detection photoelectric converting film 41, a common electrode film 64, and the protective film 43 are stacked in this sequence on the insulating film 11.

As compared with the embodiment shown in FIG. 2, in the present embodiment, the fourteen films in total (in FIG. 2, the twelve films) must be formed on the insulating film 11. However, the common electrode film 60 is disposed in the lowest layer. When the common electrode film 60 is formed as a nontransparent electrode film, therefore, the common electrode film can be used also as a light shielding film. Namely, the light shielding film 10 shown in FIG. 2 can be omitted, and hence the insulating film 9 and the insulating film 11 can be combined together.

As described above, in the embodiments, a solid-state image pickup device in which a plurality of photoelectric converting films are stacked is configured so that a photoelectric converting film is stacked above or below a common electrode film. Therefore, the number of films to be stacked on a semiconductor substrate can be reduced, so that the production cost can be lowered, and the production yield can be improved.

A method of forming vertical conductor lines (hereinafter, referred to also as columnar electrodes, the columnar electrodes 32, 37, 40) in the embodiment of the invention will be described in detail with reference to FIGS. 6A and 6B and subsequent figures. In each of the figures, FIG._A is a sectional view of the semiconductor substrate (the P-well layer of the substrate) 1 and a vertical conductor line portion of the stacked components on the substrate, and FIG._B is a top view of the uppermost film in the corresponding production step. In each figure, FIG. A shows a section taken along the line A-A in FIG._B.

Figure 6A:
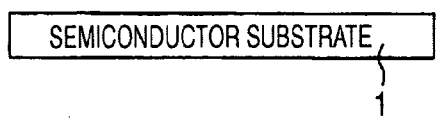
FIGS. 6A and 6B are diagrams of a procedure for producing the photoelectric converting film stack type solid-state image pickup device shown in FIG. 1.
Figure 6B:
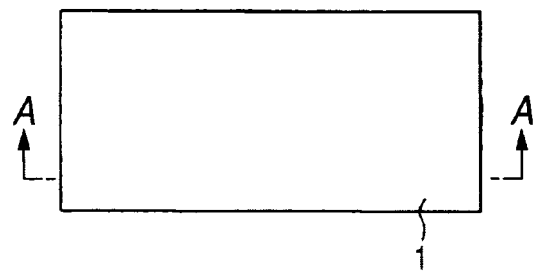

As shown in FIGS. 6A and 6B, first, the semiconductor substrate 1 is prepared. The substrate 1 has a state where the MOS circuits 3, 5, 7 and the heavily-doped impurity regions 2, 4, 6 which have been described with reference to FIG. 1 are already formed and the light shielding film 10 is stacked in the uppermost layer.

Figure 7A:
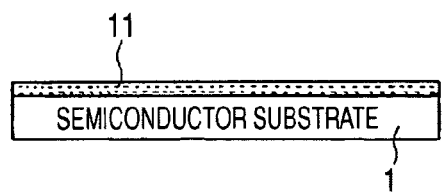
FIGS. 7A and 7B are diagrams of a step subsequent to FIGS. 6A and 6B in the procedure for producing the photoelectric converting film stack type solid-state image pickup device shown in FIG. 1.
Figure 7B:
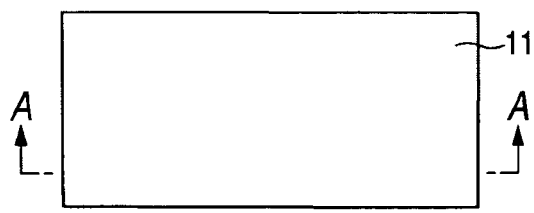

As shown in FIGS. 7A and 7B, the insulating film 11 is stacked on the semiconductor substrate 1. For example, an $SiO_2$ film is stacked by the low-temperature CVD or the like.

Figure 8A:
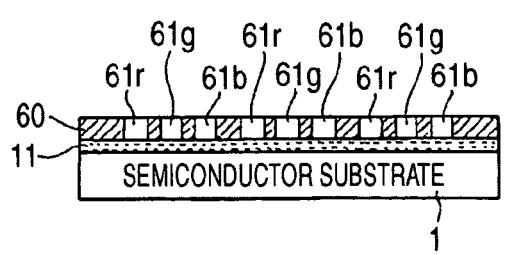
FIGS. 8A and 8B are diagrams of a step subsequent to FIGS. 7A and 7B in the procedure for producing the photoelectric converting film stack type solid-state image pickup device shown in FIG. 1.
Figure 8B:
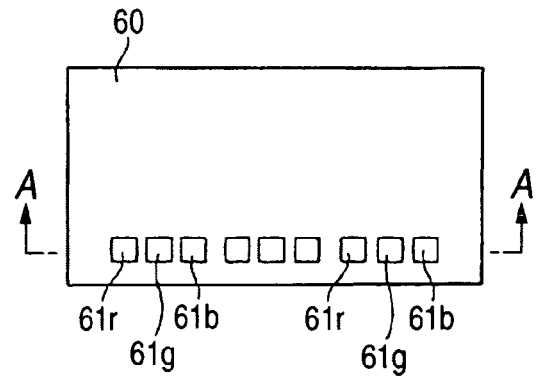

As shown in FIGS. 8A and 8B, next, a resist film 60 is stacked, and the resist film 60 is patterned to open holes 61r, 61g, 61b for the columnar electrodes. The suffixes r, g, and b correspond red (R), green (G), and blue (B), respectively. In the example shown in FIG. 8, columnar electrodes for three pixels are disposed, and hence nine holes in total are opened.

Figure 9A:
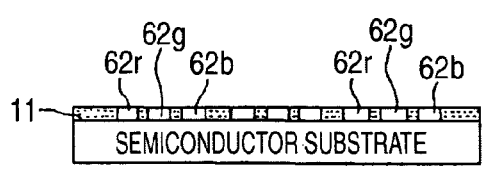
FIGS. 9A and 9B are diagrams of a step subsequent to FIGS. 8A and 8B in the procedure for producing the photoelectric converting film stack type solid-state image pickup device shown in FIG. 1.
Figure 9B:
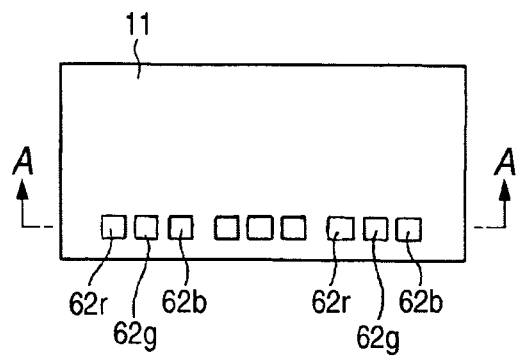

Then, an etching process is conducted so that, as shown in FIGS. 9A and 9B, holes 62r, 62g, 62b which reach the heavily-doped impurity regions 2, 4, 6 described with reference to FIG. 1 are opened in portions of the insulating film 11 which correspond to the holes 61r, 61g, 61b of the resist film 60, respectively. Thereafter, the resist film 60 is removed.

Figure 10A:
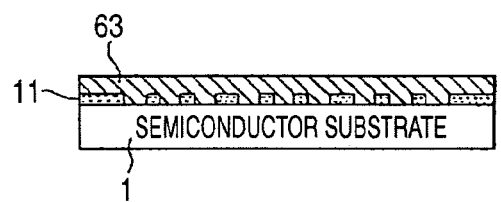
FIGS. 10A and 10B are diagrams of a step subsequent to FIGS. 9A and 9B in the procedure for producing the photoelectric converting film stack type solid-state image pickup device shown in FIG. 1.
Figure 10B:
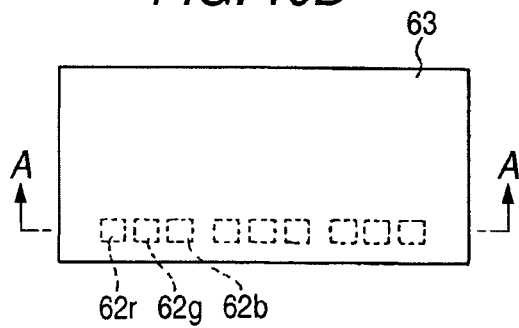

As shown in FIGS. 10A and 10B, next, a transparent electrode film 63 is stacked, and the material of the electrode film fills the holes 62r, 62g, 62b so as to be in electrical contact with the heavily-doped impurity regions 2, 4, 6, respectively. The material of the electrode film is a thin film of tin oxide ($SnO_2$), titanium oxide ($TiO_2$), indium oxide ($InO_2$), or indium tin oxide (ITO). However, the material of the electrode film is not restricted to them. For example, polysilicon doped with a high concentration of an impurity may be used as the material of the columnar electrodes and the electrode film. The electrode film is formed by the related-art film forming method such as the laser abrasion method or the sputtering method.

Figure 11A:
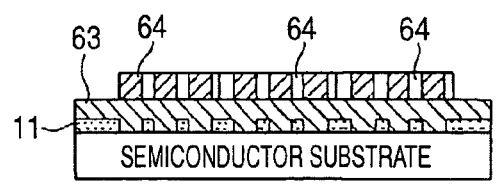
FIGS. 11A and 11B are diagrams of a step subsequent to FIGS. 10A and 10B in the procedure for producing the photoelectric converting film stack type solid-state image pickup device shown in FIG. 1.
Figure 11B:
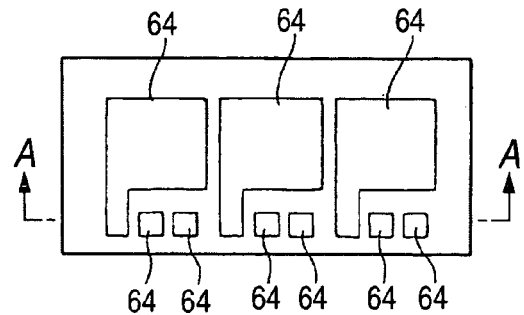

Then, a resist film 64 is stacked. As shown in FIGS. 11A and 11B, the resist film 64 is patterned so that the resist film 64 except the portions of the pixel electrode films 31 for red and the columnar electrodes 32, 37, 40 is removed.

Figure 12A:
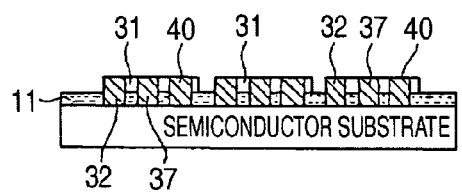
FIGS. 12A and 12B are diagrams of a step subsequent to FIGS. 11A and 11B in the procedure for producing the photoelectric converting film stack type solid-state image pickup device shown in FIG. 1.
Figure 12B:
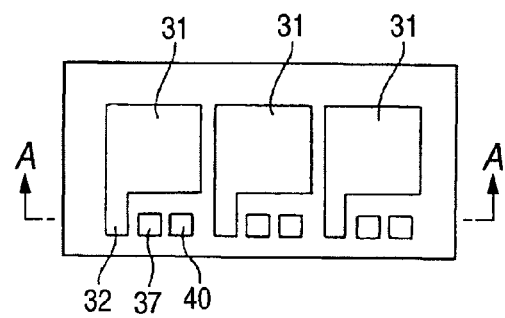

Then, an etching process is conducted to remove the electrode film 63 except the portions where the resist film 64 remains. As a result, as shown in FIGS. 12A and 12B, the pixel electrode films 31 for red and lower portions of the columnar electrodes 32, 37, 40 are formed.

Figure 13A:
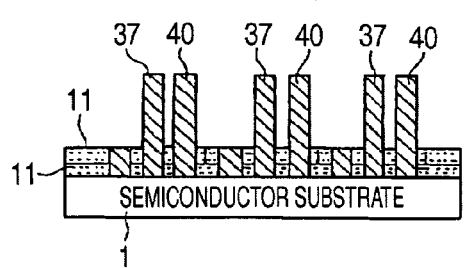
FIGS. 13A and 13B are diagrams of a step subsequent to FIGS. 12A and 12B in the procedure for producing the photoelectric converting film stack type solid-state image pickup device shown in FIG. 1.
Figure 13B:
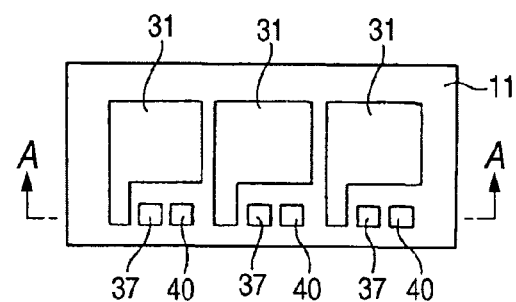

Next, for example, an insulating film is stacked and then ground away, whereby the peripheries of the pixel electrode films 31 for red and the columnar electrodes 32, 37, 40 are buried up by an insulating material 11. As shown in FIGS. 13A and 13B, thereafter, the height of the columnar electrodes 37, 40 is increased. The height is set so that the electrodes reach the pixel electrode films 36 for green.

For example, one of the above-mentioned electrode materials such as tin oxide is stacked to reach the heights, and the electrode material is etched with the use of a resist film so that the portions of the columnar electrodes 37, 40 remain, thereby heightening the columnar electrodes. Alternatively, a thick resist film is formed, holes are opened in the portions of the columnar electrodes 37, 40, and the holes are filled with the electrode material, thereby heightening the columnar electrodes. In the case where the columnar electrodes 37, 40 are tall, the heightening process may be conducted by, for example, two steps, and the height may be increased in each step by the degree corresponding to one half of the height.

Figure 14A:
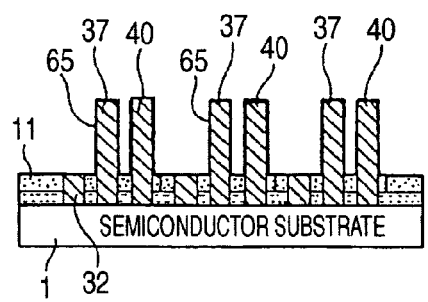
FIGS. 14A and 14B are diagrams of a step subsequent to FIGS. 13A and 13B in the procedure for producing the photoelectric converting film stack type solid-state image pickup device shown in FIG. 1.
Figure 14B:
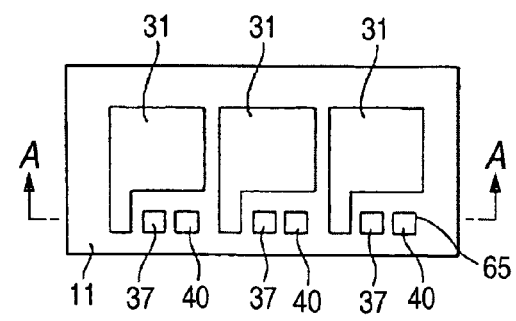

As shown in FIGS. 14A and 14B, next, the peripheries of the protruding columnar electrodes 37, 40 are covered with an insulating film 65 such as an $SiO_2$ film by the low-temperature CVD or the like.

Figure 15A:
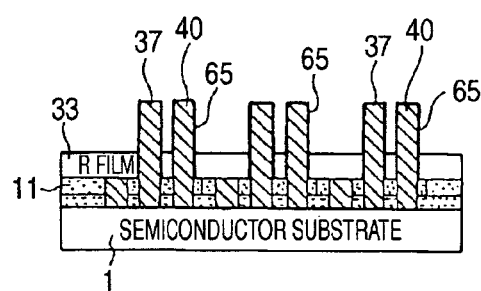
FIGS. 15A and 15B are diagrams of a step subsequent to FIGS. 14A and 14B in the procedure for producing the photoelectric converting film stack type solid-state image pickup device shown in FIG. 1.
Figure 15B:
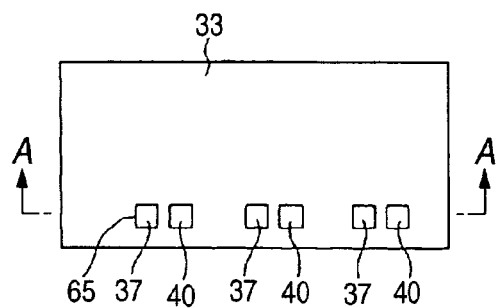

As shown in FIGS. 15A and 15B, next, the red-detection photoelectric converting film 33 is stacked. The stacking method is not particularly restricted, and the stacking process may be conducted by the sputtering method, the laser abrasion method, the printing technique, the spraying method, or the like. The material may be organic or inorganic. In the case of an inorganic material, for example, GaAlAs or Si is used. In the case of an organic material, for example, ZnPc (zinc phthalocyanine)/Alq3 (aluminum quinolinol complex) is used.

Figure 16A:
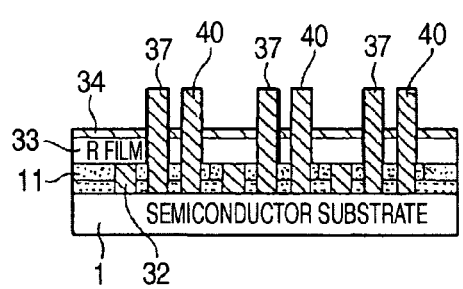
FIGS. 16A and 16B are diagrams of a step subsequent to FIGS. 15A and 15B in the procedure for producing the photoelectric converting film stack type solid-state image pickup device shown in FIG. 1.
Figure 16B:
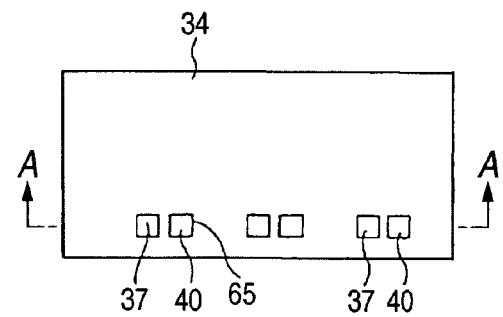
Figure 17A:
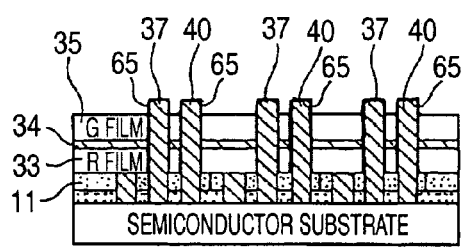
FIGS. 17A and 17B are diagrams of a step subsequent to FIGS. 16A and 16B in the procedure for producing the photoelectric converting film stack type solid-state image pickup device shown in FIG. 1.
Figure 17B:
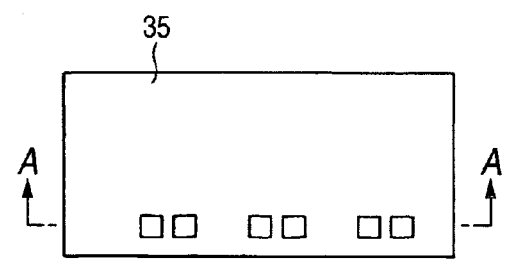

Next, the transparent common electrode film 34 of ITO or the like is stacked as shown in FIGS. 16A and 16B, and the green-detection photoelectric converting film 35 is then stacked as shown in FIGS. 17A and 17B, In the case of an inorganic material, for example, InGaAlP or GaPAs is used as the material, and, in the case of an organic material, for example, R6G/PMPS (rhodamine 6G (R6G)-doped polymethylphenylsilane) is used.

Figure 18A:
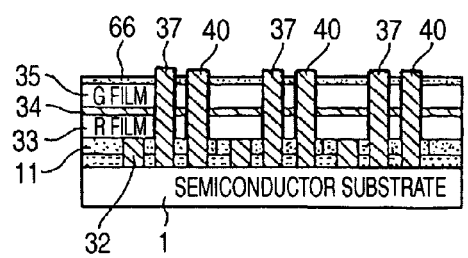
FIGS. 18A and 18B are diagrams of a step subsequent to FIGS. 17A and 17B in the procedure for producing the photoelectric converting film stack type solid-state image pickup device shown in FIG. 1.
Figure 18B:
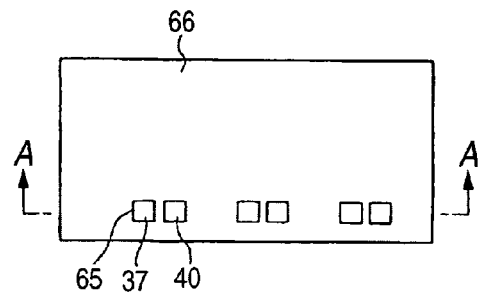
Figure 19A:
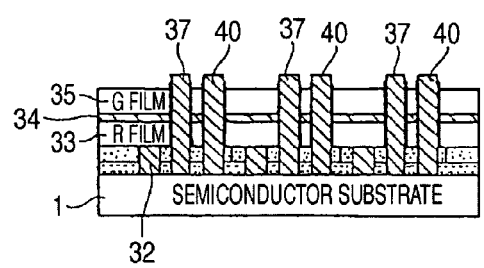
FIGS. 19A and 19B are diagrams of a step subsequent to FIGS. 18A and 18B in the procedure for producing the photoelectric converting film stack type solid-state image pickup device shown in FIG. 1.
Figure 19B:
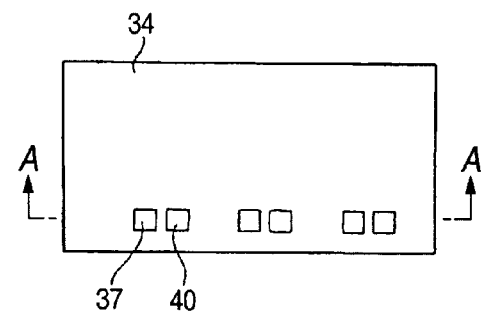

As shown in FIGS. 18A and 18B, next, a resist film 66 is formed in the uppermost layer. As a result of the steps of FIGS. 15, 16, and 17, the materials of the photoelectric converting films and the electrode film stick around the columns 37, 40. These materials dissolve in the resist film 66. Then, an etching process is conducted to remove the insulating film 65 around the columnar electrodes 37, 40 which protrude from the resist film 66, and thereafter the resist film 66 is removed (FIGS. 19A and 19B).

Figure 20A:
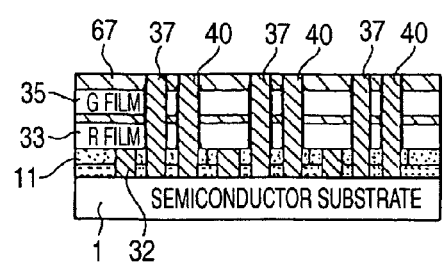
FIGS. 20A and 20B are diagrams of a step subsequent to FIGS. 19A and 19B in the procedure for producing the photoelectric converting film stack type solid-state image pickup device shown in FIG. 1.
Figure 20B:
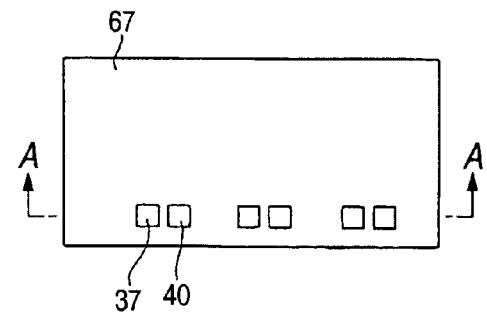
Figure 21A:
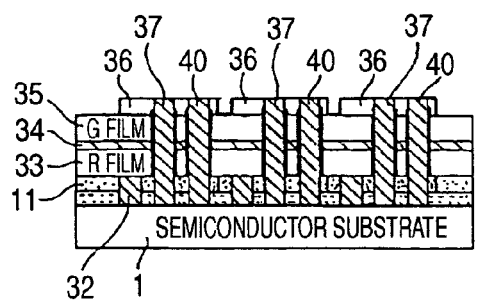
FIGS. 21A and 21B are diagrams of a step subsequent to FIGS. 20A and 20B in the procedure for producing the photoelectric converting film stack type solid-state image pickup device shown in FIG. 1.
Figure 21B:
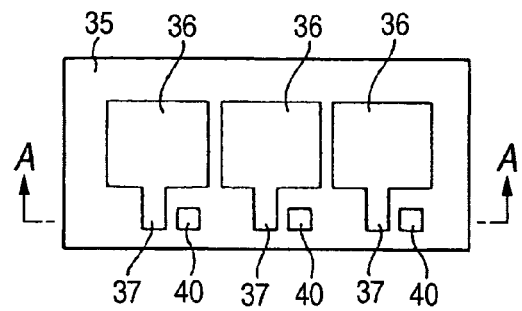

As shown in FIGS. 20A and 20B, next, a transparent electrode film 67 is stacked. In the same procedure as that of forming the pixel electrode films for red, then, the portions of the pixel electrode films 36 for green and the columnar electrodes 40 remain with the use of a resist film (FIGS. 21A and 21B).

Figure 22A:
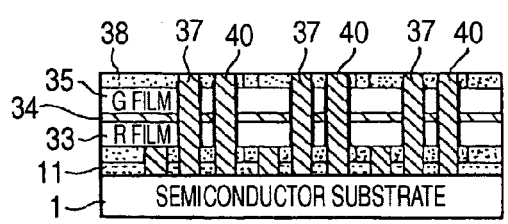
FIGS. 22A and 22B are diagrams of a step subsequent to FIGS. 21A and 21B in the procedure for producing the photoelectric converting film stack type solid-state image pickup device shown in FIG. 1.
Figure 22B:
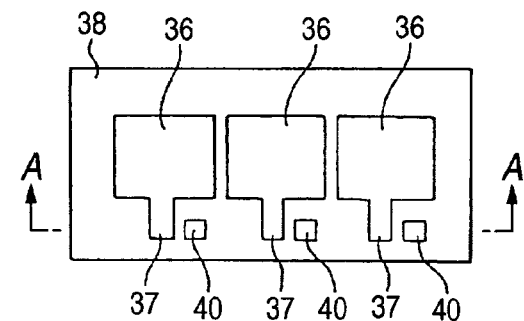
Figure 23A:
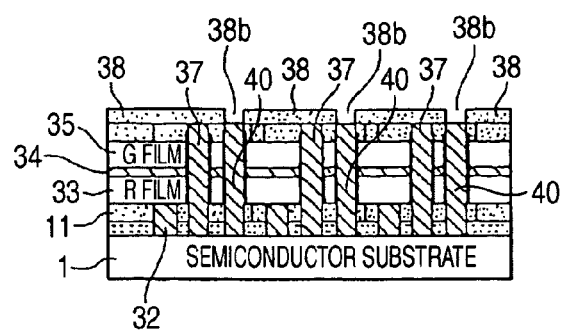
FIGS. 23A and 23B are diagrams of a step subsequent to FIGS. 22A and 22B and in the procedure for producing the photoelectric converting film stack type solid-state image pickup device shown in FIG. 1.
Figure 23B:
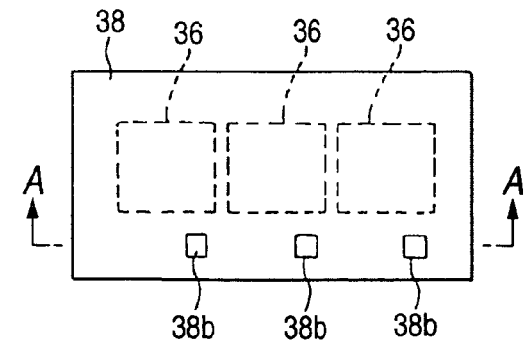

As shown in FIGS. 22A and 22B, next, the peripheries of the pixel electrode films 36 for green are buried up by the transparent insulating film 38, and the transparent insulating film 38 is further stacked thereon. As shown in FIGS. 23A and 23B, then, holes 38b are opened with the use of a resist film in the portions of the columnar electrodes 40. Thereafter, the holes 38b are filled with a transparent electrode material to increase the height of the columnar electrodes 40 and stack the electrode film on the whole face.

Figure 24A:
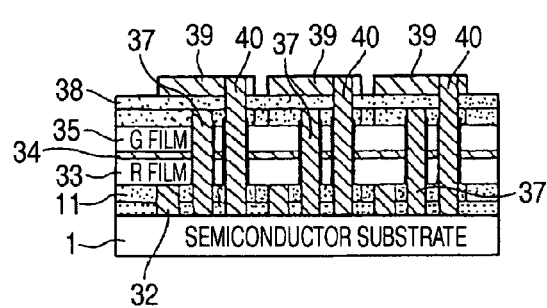
FIGS. 24A and 24B are diagrams of a step subsequent to FIGS. 23A and 23B in the procedure for producing the photoelectric converting film stack type solid-state image pickup device shown in FIG. 1.
Figure 24B:
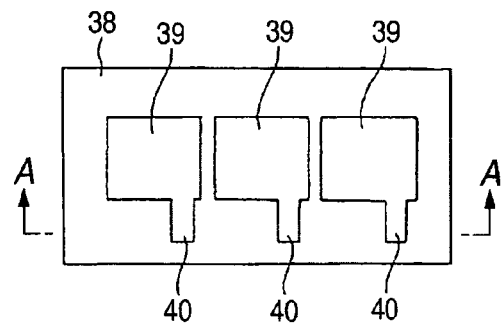
Figure 25A:
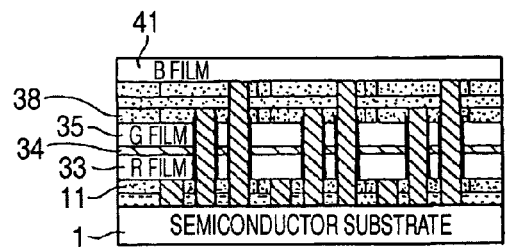
FIGS. 25A and 25B are diagrams of a step subsequent to FIGS. 24A and 24B in the procedure for producing the photoelectric converting film stack type solid-state image pickup device shown in FIG. 1.
Figure 25B:
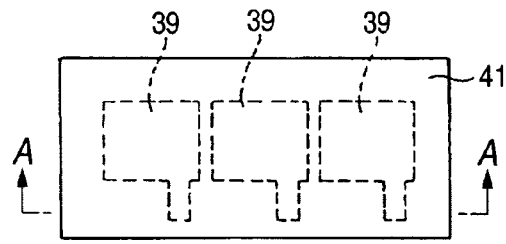

As shown in FIGS. 24A and 24B, then, the electrode film is patterned with the use of a resist film to form the pixel electrode files 39 for blue. As shown in FIGS. 25A and 25B, then, the peripheries of the pixel electrode films 39 for blue are buried up by the transparent insulating film 38, and the blue-detection photoelectric converting film 41 is stacked on the pixel electrode films 39 for blue. In the case of an inorganic material, for example, InAlP is used as the material of the blue-detection photoelectric converting film 41, and, in the case of an organic material, for example, C6/PHPPS (coumarin 6 (C6)-doped poly(m-hexoxyphenyl)phenylsilane) is used.

Figure 26A:
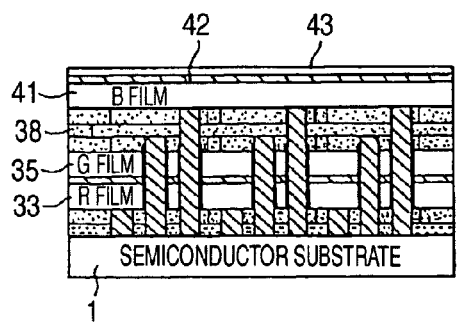
FIGS. 26A and 26B are diagrams of a step subsequent to FIGS. 25A and 25B in the procedure for producing the photoelectric converting film stack type solid-state image pickup device shown in FIG. 1.
Figure 26B:
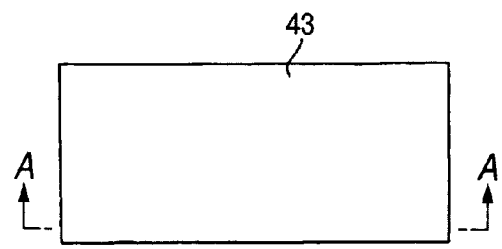

As shown in FIGS. 26A and 26B, finally, the transparent common electrode film 42 is stacked, and the protective film 43 is formed in the uppermost layer, thereby completing the production of the photoelectric converting film stack type solid-state image pickup device.

In the above, the procedure of producing the photoelectric converting film stack type solid-state image pickup device shown in FIG. 1 has been described. The photoelectric converting film stack type solid-state image pickup device shown in FIG. 2 can be produced in a similar manner. In FIGS. 6A and 6B and subsequent figures, the portions where the columnar electrodes stand are placed in the positions which are separated from the pixel electrode films 31, 36, 39. Alternatively, the columnar electrodes may stand so as to pass through the body portions of the pixel electrode films.

Figure 27:
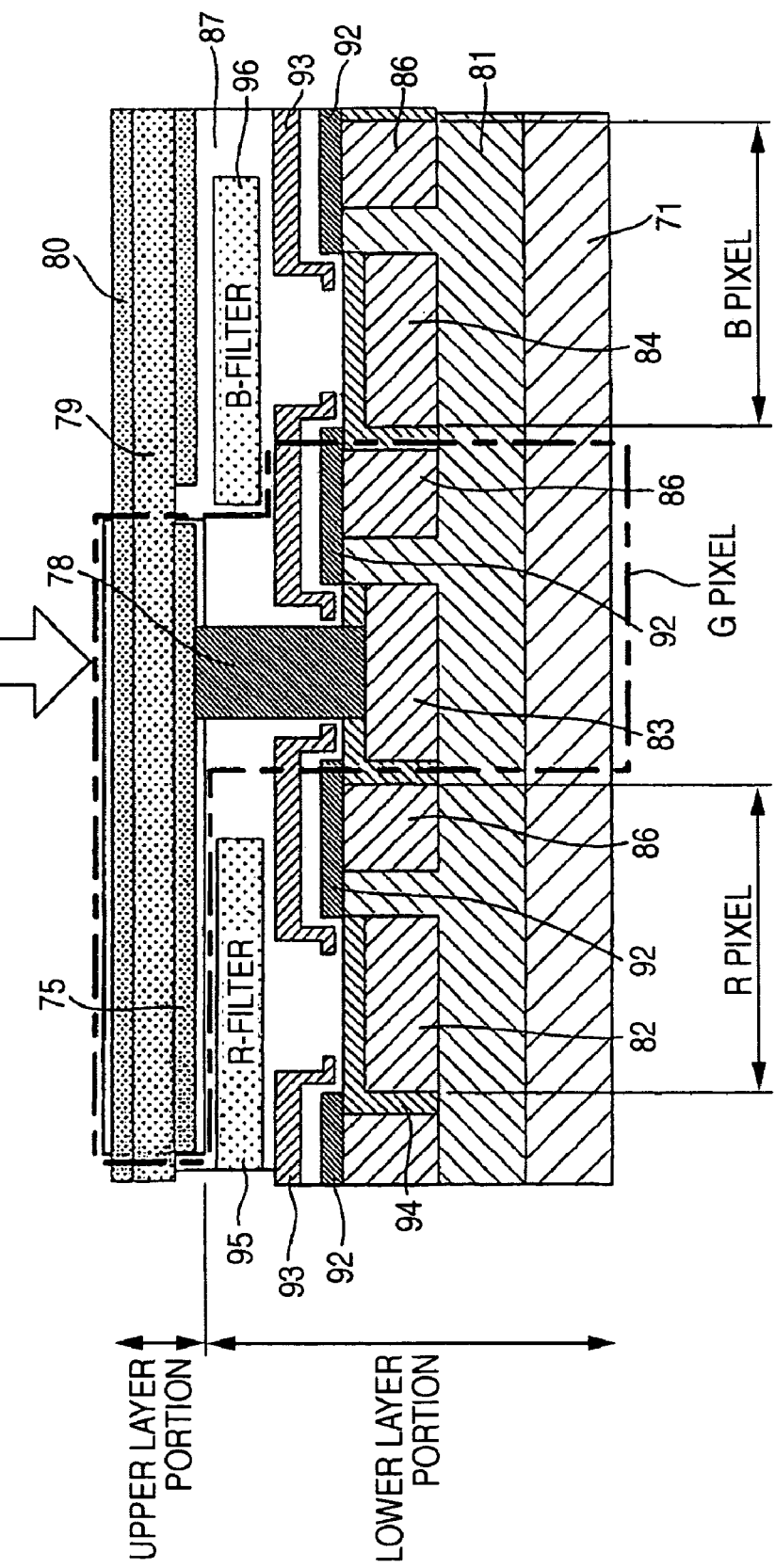
FIG. 27 is a sectional diagram showing main portions of a photoelectric converting film stack type solid-state image pickup device which is a third embodiment.

FIG. 27 is a sectional diagram of a photoelectric converting film stack type solid-state image pickup device in which only one green-detection photoelectric converting film is stacked above a semiconductor substrate, and red-light and blue-light are detected by photodiodes disposed in a surface portion of the semiconductor substrate in the same manner as the related-art image sensor.

In the photoelectric converting film stack type solid-state image pickup device, a p-well layer 81 is formed in a surface portion of an n-type semiconductor substrate 71, an n-region 82 is formed in a red (R) pixel region in a surface portion of the p-well layer 81, an n-region-84 is similarly formed in a blue (B) pixel region in the surface portion of the p-well layer 81, and thus photodiodes functioning as photoelectric converting elements are formed between the p-well layer 81 and the n-region 82, and between the p-well layer 81 and the n-region 84, respectively. Signal charges are accumulated in the n-regions 82, 84.

In the illustrated example, an n-region 83 is formed in the surface portion of the p-well layer 81 between the n-region 82 and the n-region 84, and the n-region 83 serves as a green-signal charge storage portion. An n-region 86 is disposed on the right side of each of the n-regions 82, 83, 84 and is slightly separated from the n-region 82, 83, 84. Each of the n-regions 86 serves as a vertical transfer path. A transfer electrode which serves also as a readout electrode 92 is formed above a surface portion of each of the n-regions 86 so as to reach corresponding one of the n-regions 82, 83, 84. A light shielding film 93 is disposed above each of the transfer electrodes 92.

A $p^+$-region 94 is disposed in the left side face portion and in the surface portion of each of the n-regions 82, 83, 84 so as to separate the region from the adjacent vertical transfer path 86, and reduce the defect level of the surface portion. A silicon oxide film (not shown) is formed in the uppermost surface of the semiconductor substrate 71, and the transfer electrodes 92 are formed on the silicon oxide film.

A color filter 95 through which red light is transmitted is disposed above an opening position of the light shielding film 93 above the n-region 82, and a color filter 96 through which blue light is transmitted is disposed above an opening position of the light shielding film 93 above the n-region 84. The color filters 95, 96, the light shielding film 93, and the transfer electrodes 92 are buried in a transparent insulating layer 87.

Transparent pixel electrode films 75 which are separated from one another so as to correspond to respective pixels are formed on the surface of the insulating layer 87. Each of the pixel electrode films 75 is connected to the n-region 83 by a vertical conductor line 78. The vertical conductor line 78 is electrically insulated from the other components except the corresponding pixel electrode film 75 and the n-region 83. A photoelectric converting film 79 is stacked on the pixel electrode films 75 over the whole surface of the semiconductor substrate 71, and a transparent common electrode film 80 is formed on the photoelectric converting film. The photoelectric converting film 79 which detects green light is made of, for example, a quinacridone compound such as 2,9-dimethyl quinacridone.

When light comes in the thus configured photoelectric converting film stack type solid-state image pickup device, rays in the wavelength region of green in the incident light is absorbed by the photoelectric converting film 79, and photo-charges are generated in the photoelectric converting film 79. The photo-charges flow into the n-region 83 through the vertical conductor line 78 to be held in the region. When a bias potential is applied to the common electrode film 80, the flow of photo-charges into the n-region 83 is expedited.

In the incident light, rays of the wavelength regions of red (R) and blue (B) is transmitted through the photoelectric converting film 79, and red light is then transmitted through the color filter 95 to enter the n-region 82, so that signal charges corresponding to the amount of the red light are generated to be accumulated in the n-region 82. Similarly, blue light is transmitted through the color filter 96 to enter the n-region 84, so that signal charges corresponding to the amount of the blue light are generated to be accumulated in the n-region 84.

The signal charges of red, green, and blue accumulated in the n-regions 82, 83, 84 are read out to the vertical transfer paths 86, and then transferred through the vertical transfer paths 86 to a horizontal transfer path (not shown). Thereafter, the signal charges are transferred through the horizontal transfer path to be out from the semiconductor substrate 71.

In the above-described embodiment, the signal readout circuit is configured by charge transfer paths in the same manner as a CCD sensor. Alternatively, a configuration may be employed in which a MOS transistor for reading out a signal is formed on the side of each of the n-regions 82, 83, 84. Color signals corresponding to the accumulated charges are read out from the n-regions 82, 83, 84 in the same manner as the first and second embodiments.

In the embodiment, a red signal is detected by the n-region 82 (R-pixel), a blue signal is detected by the n-region 84 (B-pixel), and a green signal is detected by the area corresponding to two pixels above the n-regions 82, 83 or the n-regions 83, 84. Therefore, the sensitivity for green which can be used also as a luminance signal is improved.

Figure 28A:
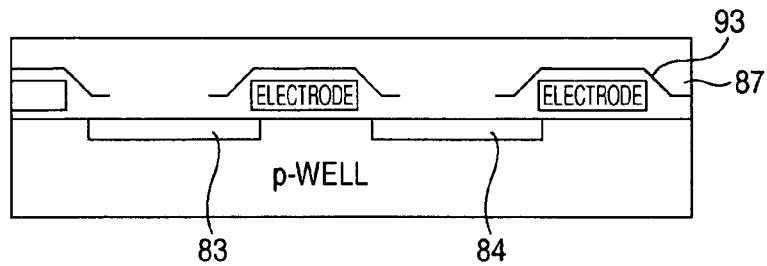
FIGS. 28A to 28E are diagrams showing steps of producing the photoelectric converting film stack type solid-state image pickup device shown in FIG. 27.

FIGS. 28A to 28E and 29A to 29D are the diagrams showing the steps of producing the photoelectric converting film stack type solid-state image pickup device shown in FIG. 27. The steps which are conducted until the photodiodes for detecting red and blue are formed in the surface portion of the semiconductor substrate 71 are identical with those in the production of the related-art CCD or CMOS image sensor. After the light shielding film 93 shown in FIG. 27 is formed, the transparent insulating film 87 such as a boron phosphorous doped oxide film (BPSG) is formed as shown in FIG. 28A, and the surface of the insulating film 87 is smoothed by CMP or the like.

Figure 28B:
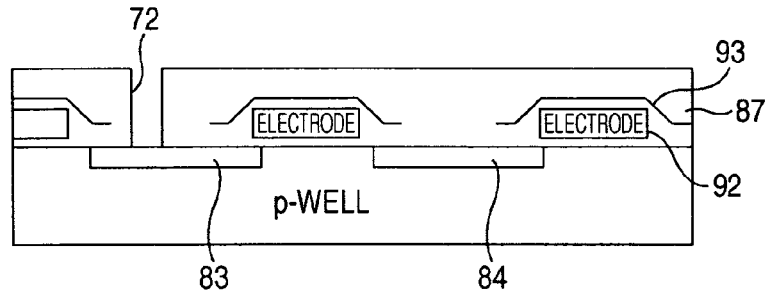
Figure 28C:
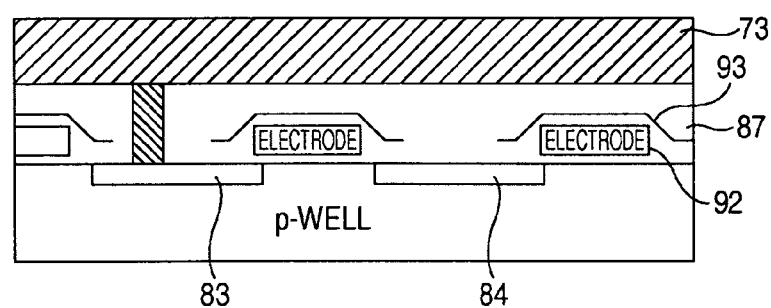

As shown in FIG. 28B, thereafter, a hole 72 which reaches the n-region 83 is opened in the insulating film 87 by an etching process, and, as shown in FIG. 28C, a film 73 of a metal such as tungsten (W) is then formed on the insulating film 87 until the hole 72 is filled.

Figure 28D:
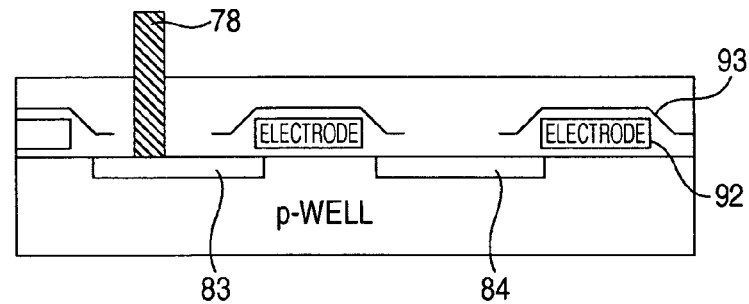
Figure 28E:
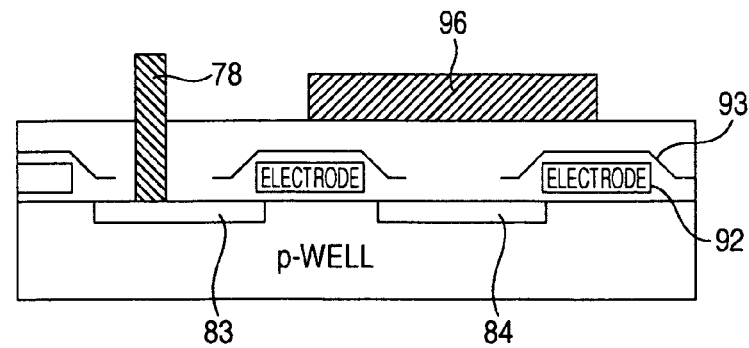

As shown in FIG. 28D, next, an unwanted portion of the tungsten film 73 is shaved away by a photolithography process and by an etching process so that the vertical conductor line 78 made of tungsten remains. As shown in FIG. 28E, the B-color filter 96 and the R-color filter 95 (not shown in FIGS. 28A to 28E and 29A to 29D) are formed on the insulating film 87.

Figure 29A:
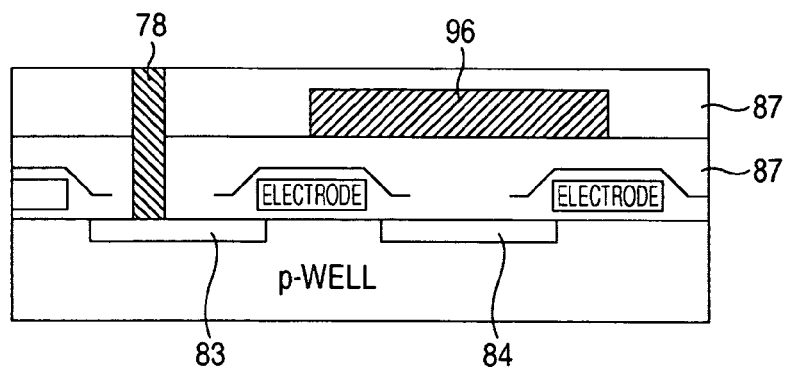
FIGS. 29A to 29D are diagrams showing steps of producing the photoelectric converting film stack type solid-state image pickup device shown in FIG. 27.

As shown in FIG. 29A, the transparent insulating film 87 is further formed until the color filters 96, 95 are buried by the insulating film 87, and the surface of the insulating film 87 is smoothed by CMP or the like. This flattening process is conducted until the metal face which is the tip end surface of the vertical conductor line 78 is exposed.

Figure 29B:
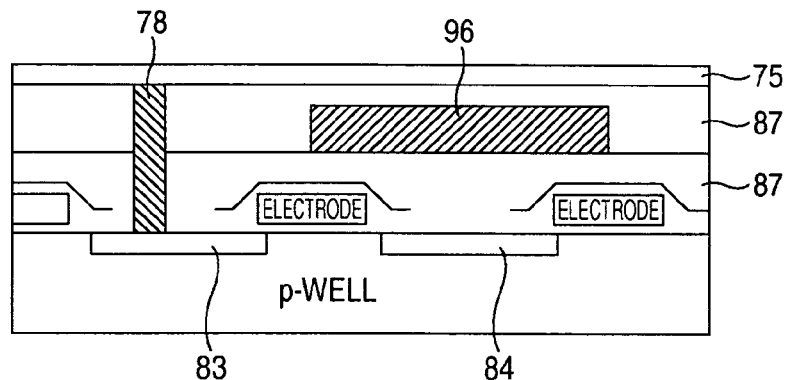

As shown in FIG. 29B, thereafter, a transparent metal film such as an ITO film is formed, and the metal film is separated by a photolithography process and an etching process to form the pixel electrode film 75.

Figure 29C:
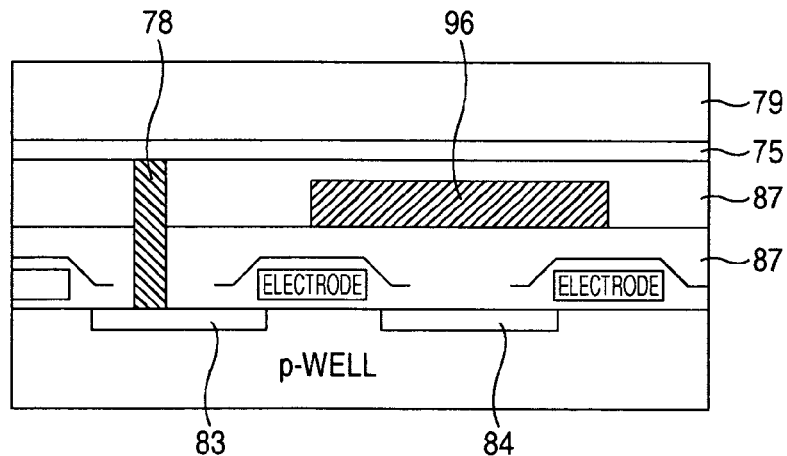
Figure 29D:
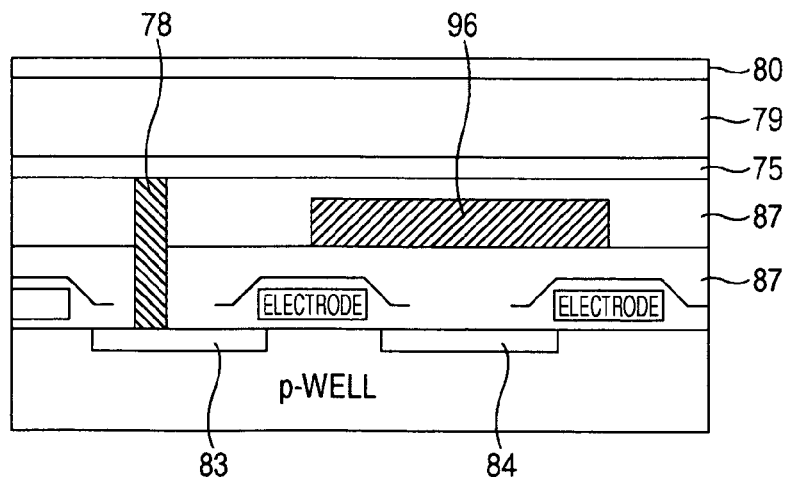

As shown in FIG. 29C, thereafter, the photoelectric converting film 79 is formed on the pixel electrode film 75, and, as shown in FIG. 29D, the common electrode film 80 is formed on the photoelectric converting film 79. As a result of the above-described steps, the vertical conductor line 78 is formed, so that the pixel electrode film 75 can be connected to the n-region 83 without causing breakage.

In the above-described embodiment, the vertical conductor lines are first formed, and the components of the layer in which the vertical conductor lines are buried are then formed Consequently, there is no possibility that, when holes for the vertical conductor lines are formed after the photoelectric converting film is formed, the material of the photoelectric converting film flows into the holes. Therefore, the solid-state image pickup device can be easily produced.

According to the invention, it is possible to reduce the number of steps of growing and stacking films of a photoelectric converting film stack type solid-state image pickup device. Therefore, the production cost can be lowered, and the production yield can be improved.

According to the invention, vertical conductor lines which play an important role in a photoelectric converting film stack type solid-state image pickup device can be easily formed without causing breakage. Therefore, the production cost can be lowered, and the production yield can be improved.

In the photoelectric converting film stack type solid-state image pickup device of the invention, it is possible to realize a low production cost and a high production yield. Therefore, the device can be used in place of the related-art CCD or CMOS image sensor.

When the method of forming columnar electrodes according to the invention is employed, a photoelectric converting film stack type solid-state image pickup device can be produced at a low cost and at a high production yield. Therefore, a photoelectric converting film stack type solid-state image pickup device can be used in place of the related-art CCD or CMOS image sensor.

The entire disclosure of each and every foreign patent application from which the benefit of foreign priority has been claimed in the present application is incorporated herein by reference, as if fully set forth.

What is claimed is:

1. A photoelectric converting film stack type solid-state image pickup device comprising:
   a semiconductor substrate in which a signal readout circuit is formed;
   a plurality of photoelectric converting films stacked above the semiconductor substrate, said plurality of photoelectric converting films comprising a first photoelectric converting film and a second photoelectric converting film;
   pixel electrode films corresponding to pixels; and
   vertical conductor lines each connected to the signal readout circuit of the semiconductor substrate and extending up to corresponding pixel electrode films,
   wherein each of the photoelectric converting films is sandwiched between a common electrode film and one of the pixel electrode films,
   wherein each of the vertical conductor lines is connected to the corresponding pixel electrode films so that photo-charges generated in the photoelectric converting films are taken out through the pixel electrode films, and
   wherein the common electrode film for the first photoelectric converting film is used also as the common electrode film for the second photoelectric converting film, the first photoelectric converting film is stacked below the common electrode film, and the second photoelectric converting film is stacked above the common electrode film.

2. A photoelectric converting film stack type solid-state image pickup device according to claim 1,
wherein said plurality of photoelectric converting films comprise three photoelectric converting films which detect red, green, and blue light, respectively, said three photoelectric converting films being arranged so that they start from an upper side in ascending order of detection wavelengths, and two of said three photoelectric converting films share one common electrode film.

3. A photoelectric converting film stack type solid-state image pickup device according to claim 1,
wherein said plurality of photoelectric converting films comprise four photoelectric converting films which detect red, green, blue, and emerald light, respectively, said four photoelectric converting films being arranged so that they start from an upper side in ascending order of detection wavelengths, and two of said four photoelectric converting films share one common electrode film, said two photoelectric converting films being adjacent to each other.

4. A photoelectric converting film stack type solid-state image pickup device according to claim 2,
wherein an additional common electrode film for the lowest one of the photoelectric converting films which are stacked on the semiconductor substrate is placed below the lowest photoelectric converting film, and the additional common electrode film is used also as a light shielding film.

5. A photoelectric converting film stack type solid-state image pickup device according to claim 3,
wherein an additional common electrode film for the lowest one of the photoelectric converting films which are stacked on the semiconductor substrate is placed below the lowest photoelectric converting film, and the additional common electrode film is used also as a light shielding film.

* * * * *